(12) United States Patent
Chang et al.

(10) Patent No.: US 7,545,170 B2
(45) Date of Patent: Jun. 9, 2009

(54) SOURCE DRIVER AND LEVEL SHIFTING METHOD THEREOF

(75) Inventors: Yu-Jui Chang, Sinshih Township (TW); Wen-Teng Fan, Sinshih Township (TW)

(73) Assignee: Himax Technologies Limited, Sinshih Township (TW)

( * ) Notice: Subject to any disclaimer, the term of this patent is extended or adjusted under 35 U.S.C. 154(b) by 0 days.

(21) Appl. No.: 11/675,427

(22) Filed: Feb. 15, 2007

(65) Prior Publication Data

US 2008/0197880 A1    Aug. 21, 2008

(51) Int. Cl.
*H03K 19/0175* (2006.01)

(52) U.S. Cl. ............................. 326/63; 326/80; 326/83; 327/333

(58) Field of Classification Search ............. 326/68–83, 326/115; 327/333, 534–537, 148, 157
See application file for complete search history.

(56) References Cited

U.S. PATENT DOCUMENTS

| | | | | |
|---|---|---|---|---|
| 5,359,298 A * | 10/1994 | Abe | ............................... | 331/2 |
| 5,808,502 A * | 9/1998 | Hui et al. | ..................... | 327/333 |
| 6,043,699 A * | 3/2000 | Shimizu | ...................... | 327/333 |
| 6,198,341 B1 * | 3/2001 | Ryu | ............................. | 327/536 |
| 6,294,950 B1 * | 9/2001 | Lee et al. | ..................... | 327/539 |
| 6,400,209 B1 * | 6/2002 | Matsuyama et al. | ......... | 327/534 |
| 6,853,217 B2 * | 2/2005 | Tanaka et al. | ................. | 326/68 |
| 6,897,706 B2 * | 5/2005 | Coutu | ........................ | 327/423 |
| 7,138,831 B2 * | 11/2006 | Tobita | ......................... | 326/81 |
| 7,479,820 B2 * | 1/2009 | Okamoto et al. | ............ | 327/535 |
| 7,504,869 B2 * | 3/2009 | Tobita et al. | ................ | 327/117 |

* cited by examiner

*Primary Examiner*—James H. Cho
*Assistant Examiner*—Crystal L Hammond

(57) ABSTRACT

The present invention provides a source driver comprising a shift register, a line buffer for storing a data signal and outputting a buffered data signal, and a level shifter for generating a level-shifted data signal based on the buffered data signal. The line buffer further comprises a charge pump supplying a pumped voltage based on a voltage source and a buffer powered by the pumped voltage and outputting a buffered data signal based on the data signal.

15 Claims, 6 Drawing Sheets

SOURCE DRIVER AND LEVEL SHIFTING METHOD THEREOF

FIELD OF THE INVENTION

The present invention relates to a display, and more particularly, to a driver of the display.

BACKGROUND OF THE INVENTION

FIG. 1 illustrates a source driver used in an LCD (Liquid Crystal Display) device. The source driver 100 shown in FIG. 1 comprises a shift register 102, a line buffer 104, a level shifter 106 and a digital-to-analog converter (DAC) 108. The line buffer 104 stores and outputs digital data signals by the control of the shift register 102. The level shifter 106 shifts voltage levels of the digital data signals. The digital-to-analog converter (DAC) 108 generates a driving voltage Vd to drive the LCD according to the outputted signals from the level shifter 106.

FIG. 2 illustrates a conventional level shifter. As shown in FIG. 2, the level shifter 106 comprises a first transistor 202, a second transistor 204, a third transistor 206, a fourth transistor 208, and a fifth transistor 210. The level shifter 106 receives the high voltage source VDDA via the transistor 210, receives input voltages via the input nodes IN1 and IN2 for outputting via output nodes OUT and OUTB.

To speed up and save power, the voltage source of ICs tends to decrease, for example from 3.3V to 2.5V and further to 1.8V. However, the transition of the level shifter would become slower since the voltage level of the input signal is decreased such that the response time of the transistors of the level shifter is increased.

SUMMARY OF THE INVENTION

Therefore, one objective of the present invention is to provide a level shifting apparatus and driving method to speed up the transition thereof.

According to the aforementioned objective, the present invention provides a source driver comprising a shift register, a line buffer for storing a data signal and outputting a buffered data signal, and a level shifting apparatus for generating a level-shifted data signal based on the buffered data signal. The level shifting apparatus further comprises a charge pump supplying a pumped voltage based on a voltage source and a buffer powered by the pumped voltage and outputting a buffered data signal based on the data signal.

According to another aforementioned objective, the present invention provides a level shifting method. The method receives a data signal and supplies a pumped voltage based on a voltage source. The method then outputs a buffered data signal based on the data signal by a buffer powered by the pumped voltage. A level-shifted data signal is then generated based on the buffered data signal.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

In order to make the illustration of the present invention more explicit and complete, the following description is stated with reference to FIGS. 3 through 6.

Figure 1:
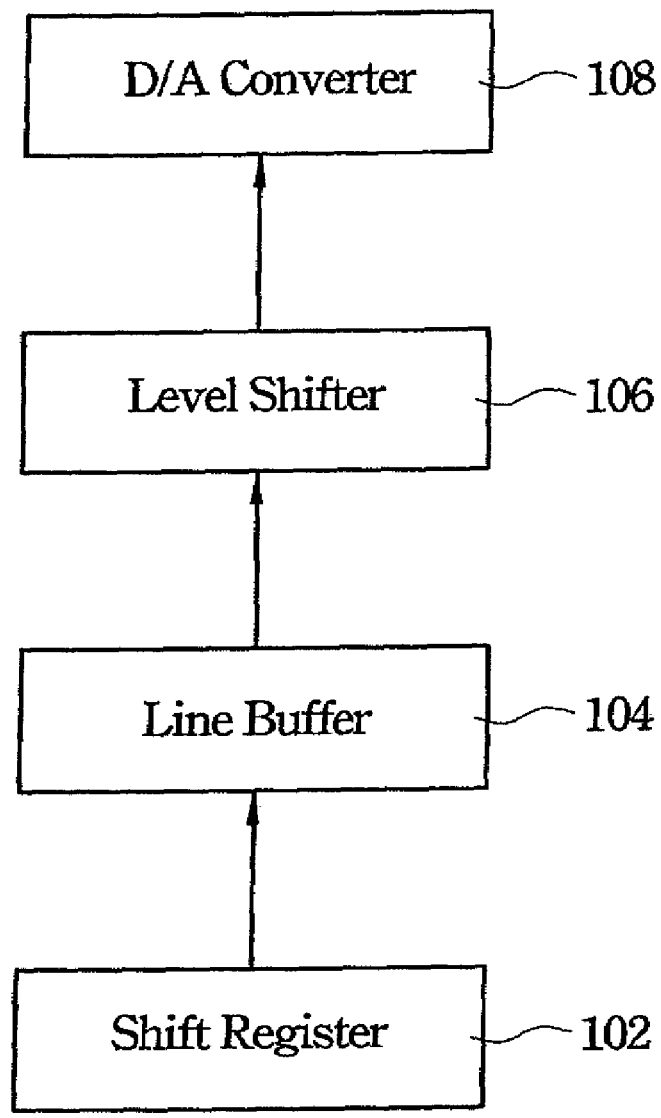
FIG. 1 illustrates a source driver used in an LCD device.
Figure 2:
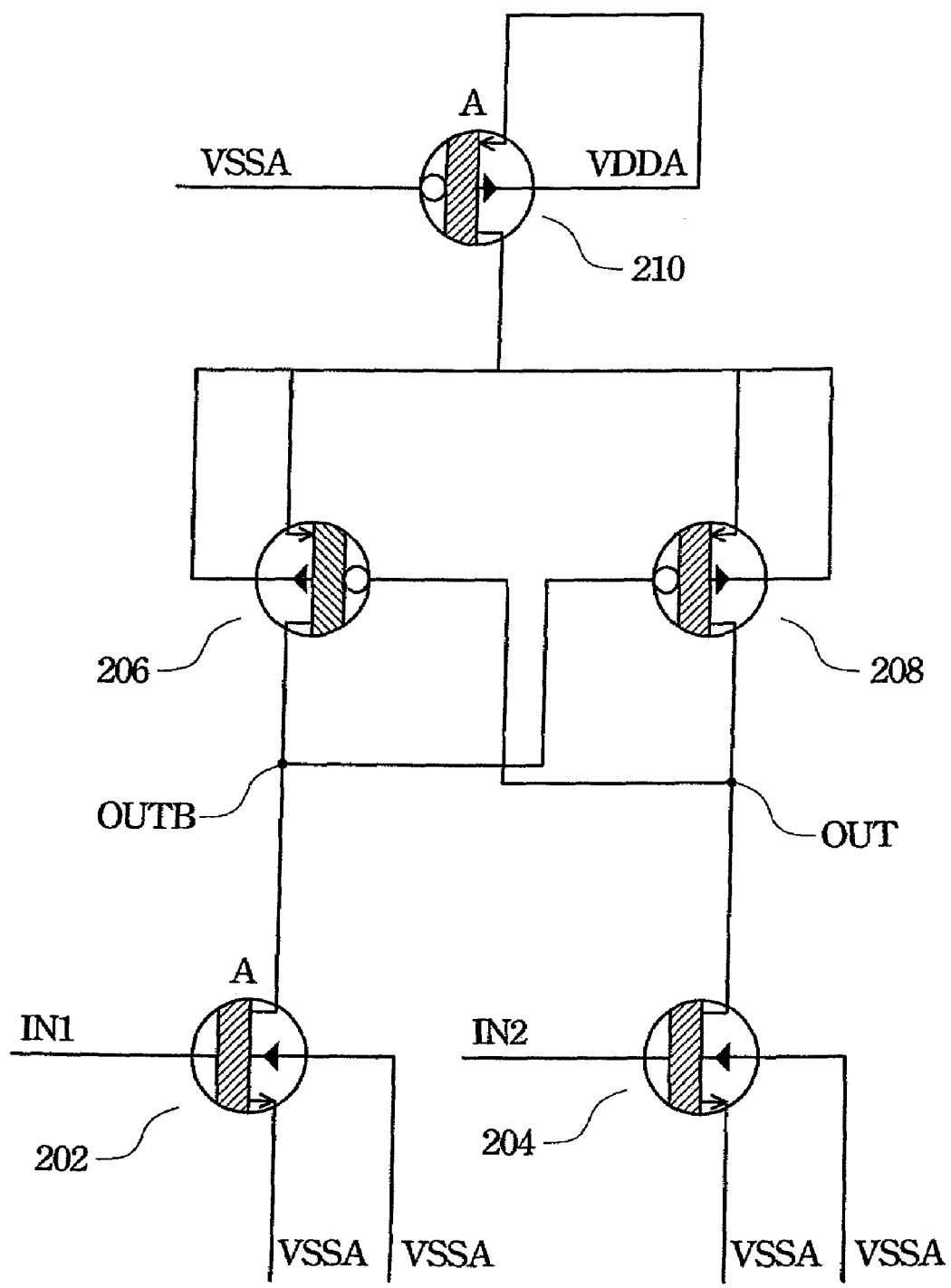
FIG. 2 illustrates a conventional level shifter.
Figure 3:
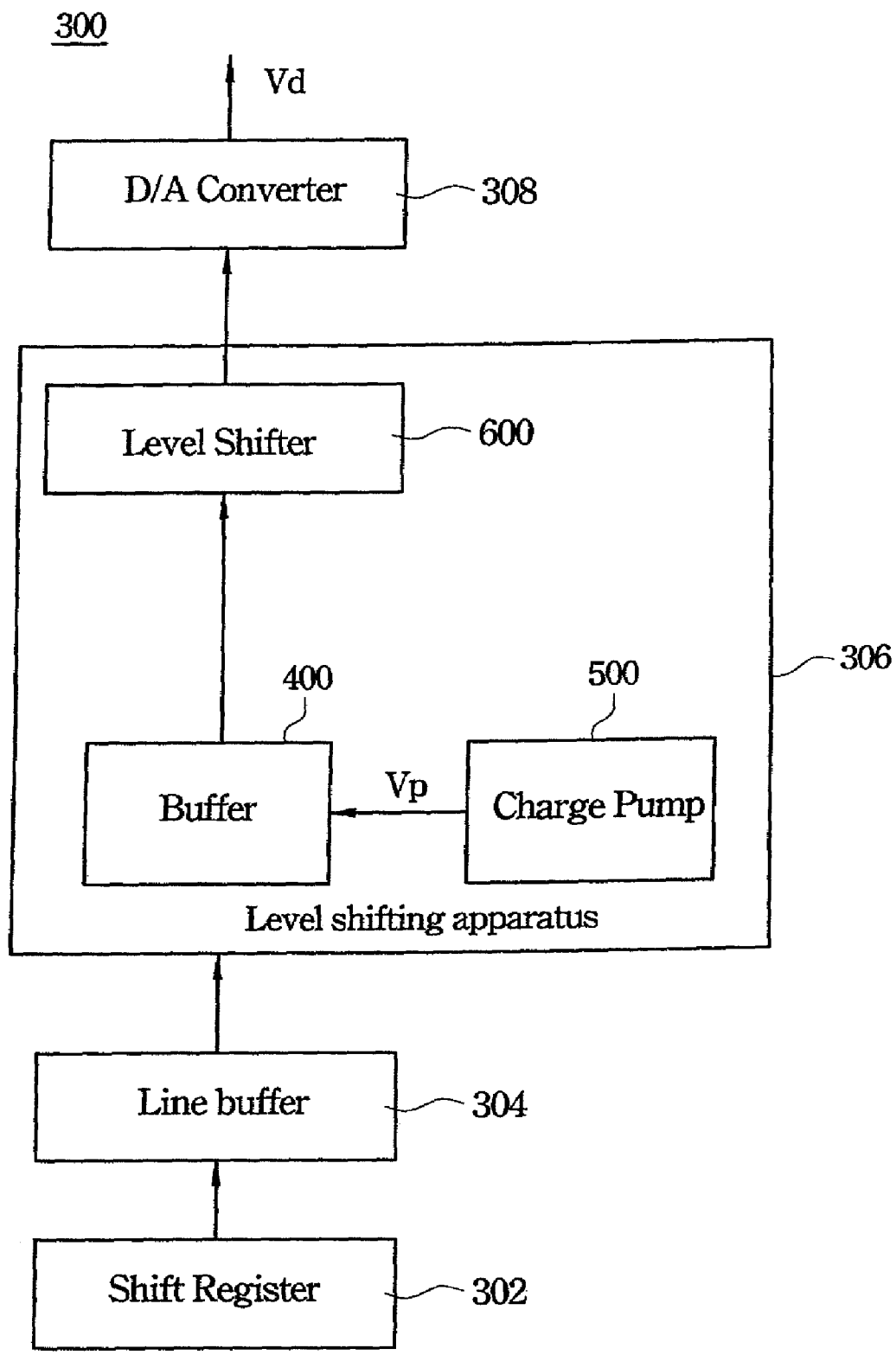
FIG. 3 illustrates a source driver used in an LCD device according to the preferred embodiment of the present invention.

FIG. 3 illustrates a source driver used in an LCD device according to the preferred embodiment of the present invention. The source driver 300 shown in FIG. 3 comprises a shift register 302, a line buffer 304, a level shifting apparatus 306 and a digital-to-analog converter (DAC) 308. The line buffer 304 is used to store a data signal in the control of the shifter register 302 and outputs a buffered data signal. The level shifting apparatus 306 receives the buffered data signal and shifts the level of the buffered data signal. The digital-to-analog converter (DAC) 308 receives the level-shifted data signal to output a driving voltage Vd to drive the LCD.

The level shifting apparatus 306 comprises a buffer 400, a charge pump 500 and a level shifter 600. The charge pump 500 supplies a pumped voltage Vp based on a voltage source that is a low voltage source VDDD supplied to the source driver 300. Usually the low voltage source VDDD is provided for the shift register 302 and the line buffer 304, and a high voltage source VDDA is provided for the level shifter 600 and the D/A converter 308. The buffer 400 is powered by the pumped voltage Vp and receives the data signal for generating a buffered data signal to the level shifter 600. The pumped voltage Vp is larger than the low voltage source VDDD such that the buffered data signal from the buffer 400 is larger in magnitude, and therefore the transition of the level shifter 600 is made quicker. The detail of the level shifting apparatus 306 is described as follows.

Figure 4:
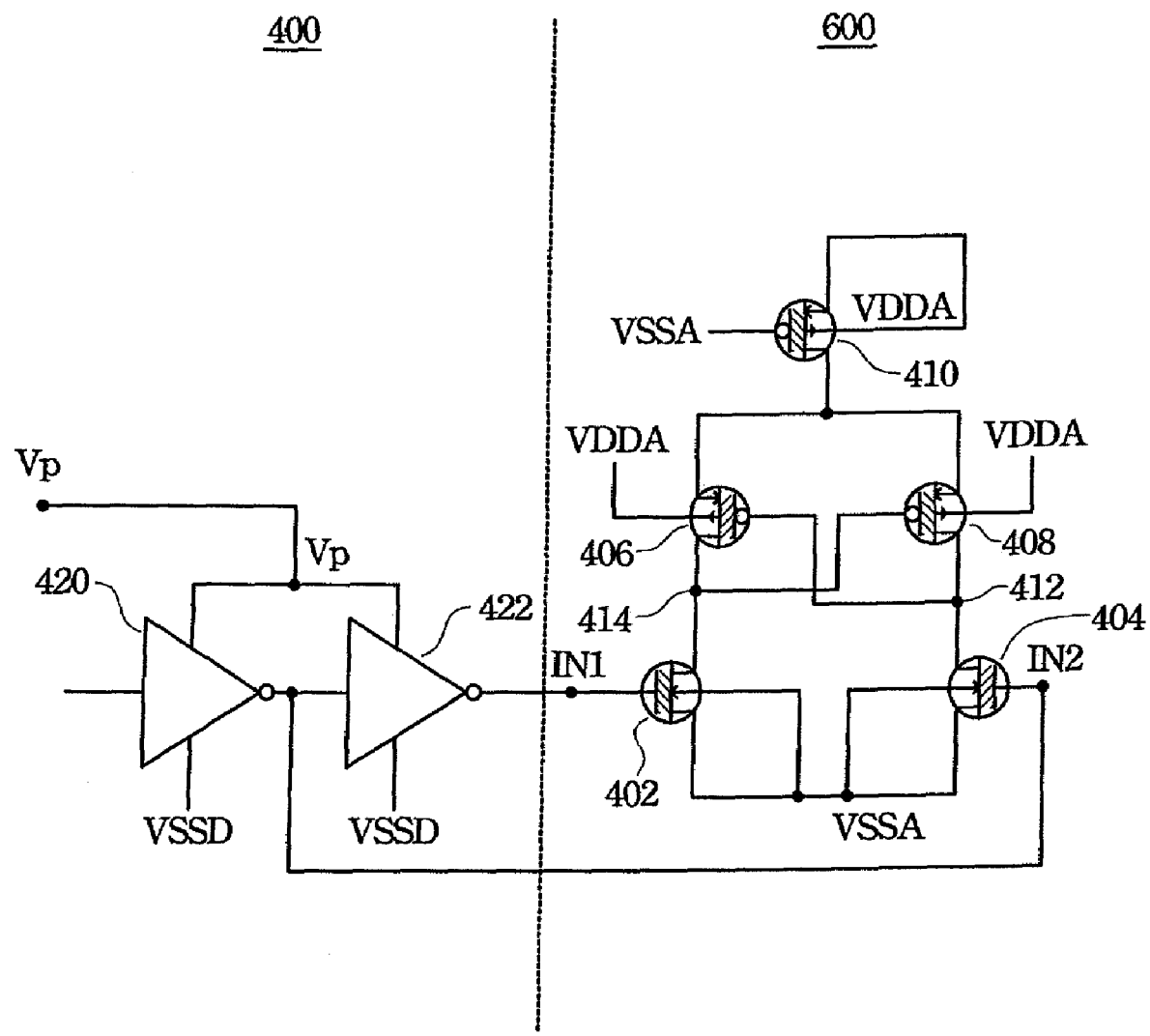
FIG. 4 illustrates a circuit diagram of the buffer and the level shifter of the level shifting apparatus according to the preferred embodiment of the present invention.

FIG. 4 illustrates a circuit diagram of the buffer 400 and the level shifter 500 of the level shifting apparatus 306 according to the preferred embodiment of the present invention. The level shifter 600 comprises a first transistor 402, a second transistor 404, a third transistor 406, a fourth transistor 408, and a fifth transistor 410. The first transistor 402 and the second transistor 404 are N type transistors while the third transistor 406, the fourth transistor 408 and the fifth transistor 410 are P type transistors. The first transistor 402 has a first source/drain connected to VSSA voltage, a second source/drain connected to an inverted output node 414, and a gate as a first input node IN1. The second transistor 404 has a first source/drain connected to the VSSA voltage, a second source/drain connected to an output node 412, and a gate as a second input node IN2. The third transistor 406 has a first source/drain connected to the inverted output node 414, a gate connected to the output node 412, and a second source/drain. The fourth transistor 408 has a first source/drain connected to the output node 412, a gate connected to the inverted output node 414, and a second source/drain connected to the second source/drain of the third transistor 406. The fifth transistor 410 has a first source/drain connected to the second source/drains of the third transistor 406 and the fourth transistor 408, a second source/drain connected to a high voltage source VDDA, and a gate connected to VSSA voltage.

The buffer 400 comprises a first inverter 420 and a second inverter 422. The first inverter 420 is powered by the pumped voltage Vp and receives the data signal from the line buffer 304 to output an inverted buffered data signal. The second inverter 422 is powered by the pumped voltage Vp and receives the inverted buffered data signal to output the buffered data signal. The buffered data signal is transmitted to the input node IN1 of the level shifter 600. The inverted buffered data signal is transmitted to the second input node IN2 of the level shifter 600. The level shifter 600 receives the buffered data signal and the inverted buffered data signal to output the level-shifted data signal.

Figure 5A:
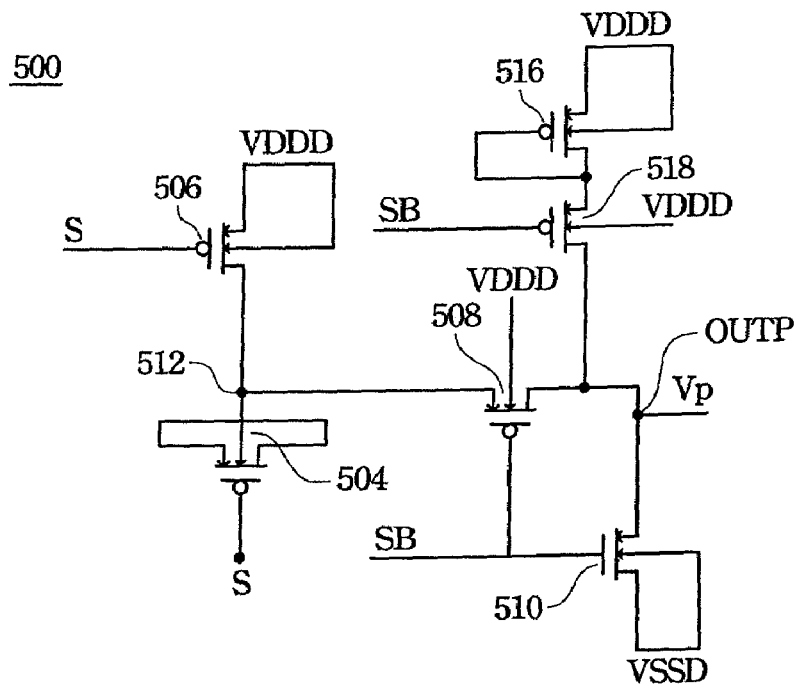
FIG. 5A illustrates a circuit diagram of the charge pump according to the preferred embodiment of the present invention.

There are plural types of charge pumps. FIG. 5A is a circuit diagram of one example of the charge pump. The charge pump 500 comprises a sixth transistor 504, a seventh transistor 506, an eighth transistor 508, a ninth transistor 510, a tenth transistor 516 and an eleventh transistor 518. The charge pump 500 receives the pumping signal Sp for outputting the pumped voltage Vp. While the pumping signal Sp is at a high level, the pumped voltage Vp is larger than the low voltage source VDDD. The pumped voltage Vp is used for powering the buffer 400 to enhance the output voltage level thereof.

The structure of the charge pump 500 is described as following. The sixth transistor 504, functioning as a capacitor, has a first node 512 and a gate to receive the pumping signal S. The seventh transistor 506, functions as a switch, selectively connects the low voltage source VDDD and the first node 512 of the sixth transistor 504 and is controlled by the pumping signal S. The eighth transistor 508, functioning as a switch and controlled by the inversed pumping signal SB, selectively connects the first node 512 of the sixth transistor 504 and a pump output node OUTP. The ninth transistor 510, functioning as a switch and controlled by the inversed pumping signal SB, is connected between the pump output node OUTP and the voltage VSSD. The tenth transistor 516, functioning as a diode, is connected between the low voltage source VDDD and the pump output node OUTP. The eleventh transistor 518, functioning as a switch and controlled by the inversed pumping signal SB, selectively connects the low voltage source VDDD and the pump output node OUTP. It should be noted that, according to another embodiment, the ninth transistor 510 may be absent and the eleventh transistor 518 is instead controlled by the pumping signal S.

The operation of the charge pump 500 is described as following. At first, the pumping signal S is at a low level, the eighth transistor 508 and the eleventh transistor 518 are turned off, and the seventh transistor 506 and the ninth transistor 510 are turned on. The voltage level at the first node 512 is VDDD. The voltage level at the pump output node OUTP is VSSD.

Secondly, the pumping signal S is at a high level, the eighth transistor 508 and the eleventh transistor 518 are turned on, and the seventh transistor 506 and the ninth transistor 510 are turned off. The voltage level at the first node 512 is thus higher than VDDD and the pumped voltage Vp is thus generated at the pump output node OUTP. Furthermore, a current flows from the low voltage source VDDD to the pump output node OUTP through the eleventh transistor 518 to supply a voltage to the pump output node OUTP.

Figure 5B:
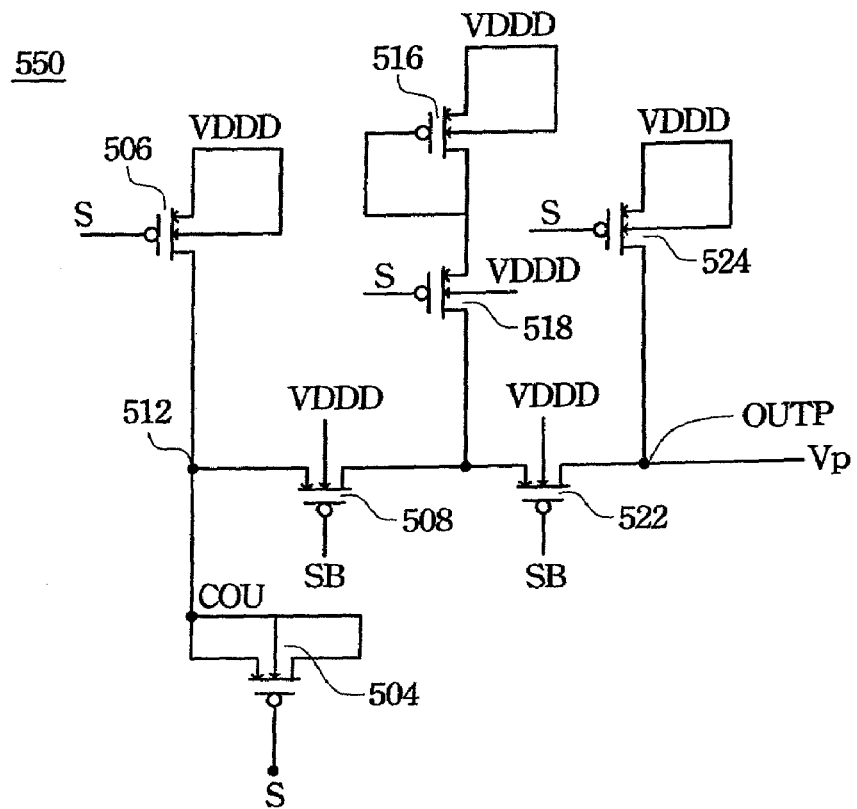
FIG. 5B illustrates a circuit diagram of the charge pump according to another embodiment of the present invention.

FIG. 5B is a circuit diagram of another example of the charge pump. Compared to the charge pump 500, the charge pump 550 does not have the ninth transistor 510 and has two more transistors 522 and 524. The transistor 522 is controlled by the inversed pumping signal SB. The transistor 524 is controlled by the pumping signal S. While the pumping signal S is at the low level, the voltage level at the pump output node OUTP is VDDD. While the pumping signal S is at the high level, the voltage level at the pump output node OUTP is the pumped voltage Vp that is larger than VDDD.

Figure 6A:
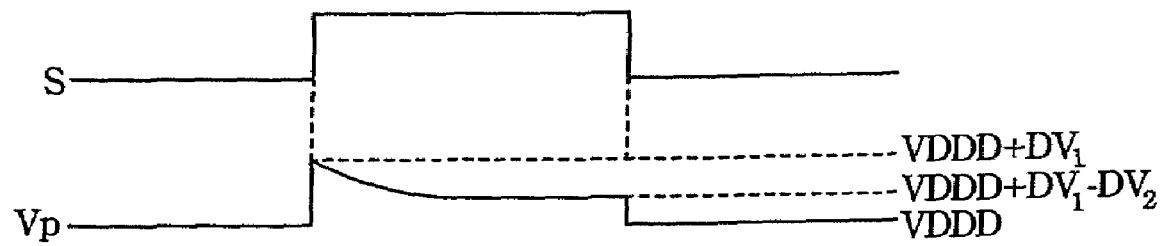
FIG. 6A illustrates a timing chart for driving the charge pump according to the preferred embodiment of the present invention.

FIG. 6A is a timing chart of a first driving method of the charge pump 550. The pumping signal S is generated in accordance with the data signal from the line buffer 304. The timing of the rising edge of the pumping signal S is in accordance with the timing of the rising edge of the data signal. The pumping signal S is a pulse signal and the duration time thereof is for example in accordance with a transition time of the level shifter 600. The pumped voltage Vp is at first pumped to VDDD+DV1, then drops to VDDD+DV1−DV2 due to charging the intrinsic capacitors of the buffer 400, where DV2<DV1. The pumped voltage Vp is larger than VDDD such that output capability of the buffer 400 is enhanced.

Figure 6B:
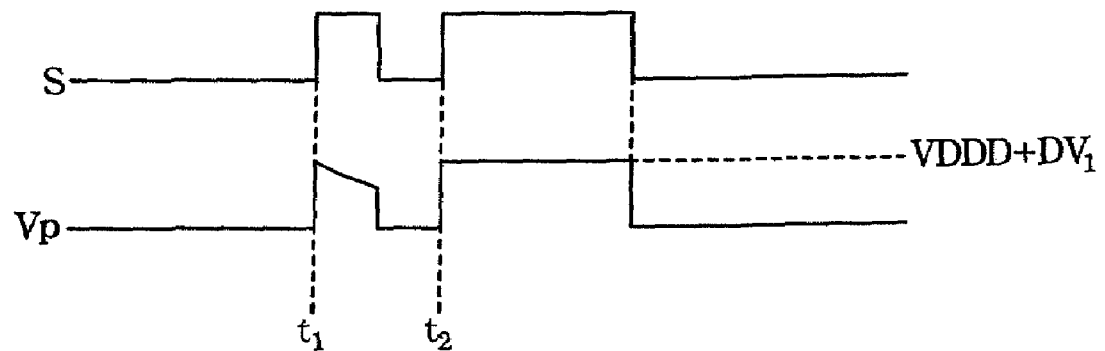
FIG. 6B illustrates a timing chart for driving the charge pump according to another embodiment of the present invention.

FIG. 6B is a timing chart of a second driving method of the charge pump 550. The second driving method generates the pumping signal S having two steps. At time t1, the pumping signal S is pulled high such that the pumped voltage Vp is pumped to VDDD+DV1, and then the pumped voltage Vp drops due to charging the intrinsic capacitors of the buffer 400. At time t2, the pumping signal S is pulled high again such that pumped voltage Vp is kept at the level of VDDD+DV1 and would almost not drop because the intrinsic capacitors of buffer 400 has been charged at time t1. Therefore, the pumped voltage Vp by the second driving method is larger than the pumped voltage Vp by the first driving method.

The above described first driving method and second driving method can also be applied other types of charge pumps, such as the charge pump 500, not limited to the charge pump 550. The charge pump may be of any other type other than the charge pumps 500 and 550.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A source driver, comprising:
   a shift register;
   a line buffer for storing a data signal in the control of the shift register; and
   a level shifting apparatus comprising:
      a charge pump, supplying a pumped voltage based on a voltage source, wherein the pumped voltage is larger than the voltage source;
      a buffer powered by the pumped voltage and outputting a buffered data signal based on the data signal; and
      a level shifter, for generating a level-shifted data signal based on the buffered data signal, wherein the charge pump receives a first pumping signal to pump the voltage source while the data signal is input from the line buffer to the level shifting apparatus, the first pumping signal is a pulse signal whose duration time is in accordance with a transition time of the level shifter.

2. The source driver as claimed in claim 1, wherein the timing of the rising edge of the first pumping signal is in accordance with the timing of the rising edge of the data signal.

3. The source driver as claimed in claim 1, wherein the first pumping signal has two pulses corresponding to one data signal.

4. The source driver as claimed in claim 1, wherein the buffer comprises:
a first inverter powered by the pumped voltage and receives the data signal to output an inverted buffered data signal; and
a second inverter powered by the pumped voltage and receives the inverted buffered data signal to output the buffered data signal.

5. The source driver as claimed in claim 4, wherein the level shifter receives the buffered data signal and the inverted buffered data signal as input to output the level-shifted data signal.

6. The source driver as claimed in claim 1, wherein the voltage source is a low voltage source supplied to the source driver, while the level shifter is powered by a high voltage source supplied to the source driver.

7. The source driver as claimed in claim 1, wherein the level shifter comprises:
a first transistor, with a first source/drain connected to a ground, a second source/drain connected to an inverted output node, and a gate as a first input node;
a second transistor, with a first source/drain connected to the ground, a second source/drain connected to an output node, and a gate as a second input node;
a third transistor with a first source/drain connected to the inverted output node, a gate connected to the output node, and a second source/drain;
a fourth transistor with a first source/drain connected to the output node, a gate connected to the inverted output node, and a second source/drain connected to the second source/drain of the third transistor; and
a fifth transistor with a first source/drain connected to the second source/drains of the third transistor and the fourth transistor, a second source/drain connected to a high voltage source, and a gate.

8. The source driver as claimed in claim 7, wherein the first transistor and the second transistor are N type transistors while the third transistor, the fourth transistor and the fifth transistor are P type transistors.

9. The source driver as claimed in claim 1, wherein the charge pump comprises:
a capacitor with a first node and a second node, wherein the second node receives a pumping signal;
a first switch selectively connecting the voltage source and the first node of the capacitor;
a second switch selectively connecting the first node of the capacitor and a pump output node of the charge pump to output the pumped voltage to the buffer; and
a third switch selectively connecting the pump output node and the voltage source.

10. The source driver as claimed in claim 9, wherein the pumping signal is in accordance with the data signal.

11. The source driver as claimed in claim 9, wherein when the pumping signal is at a low level, the second switch is turned off, the first switch and the third switch are turned on.

12. The source driver as claimed in claim 9, wherein when the pumping signal is at a high level, the second switch is turned on, the first switch and the third switch are turned off.

13. A level shifting method comprising steps of:
receiving a data signal;
supplying a pumped voltage based on a voltage source, wherein the pumped voltage is larger than the voltage source; and
outputting a buffered data signal based on the data signal by a buffer powered by the pumped voltage; and
generating a level-shifted data signal based on the buffered data signal, wherein a charge pump receives a first pumping signal to pump the voltage source while the data signal is input to the buffer, the first pumping signal is a pulse signal whose duration time is in accordance with a transition time of the level shifter.

14. The method as claimed in claim 13, wherein the timing of the rising edge of the first pumping signal is in accordance with the timing of the rising edge of the data signal.

15. The method as claimed in claim 13, wherein the first the pumping signal has two pulses corresponding to one rising edge of the data signal.

* * * * *